United States Patent
Chen et al.

(10) Patent No.: US 12,224,743 B2
(45) Date of Patent: Feb. 11, 2025

(54) BUFFER FOR VOLTAGE CONTROLLED OSCILLATOR (VCO) OR OTHER APPLICATIONS

(71) Applicant: QUALCOMM Incorporated, San Diego, CA (US)

(72) Inventors: Luis Chen, Chula Vista, CA (US); Kevin Jia-Nong Wang, Poway, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 162 days.

(21) Appl. No.: 18/155,535

(22) Filed: Jan. 17, 2023

(65) Prior Publication Data

US 2024/0243744 A1  Jul. 18, 2024

(51) Int. Cl.
*H03K 17/687* (2006.01)
*H03L 7/08* (2006.01)
*H04B 1/40* (2015.01)

(52) U.S. Cl.
CPC ........... *H03K 17/6872* (2013.01); *H03L 7/08* (2013.01); *H04B 1/40* (2013.01)

(58) Field of Classification Search
CPC ........ H03K 17/6872; H03K 19/018528; H03L 7/08; H04B 1/40; H03F 2203/45084; H03F 2203/45244; H03F 2203/45418; H03F 2203/45422; H03F 2203/45596; H03F 3/45179; H03F 3/45569
See application file for complete search history.

(56) References Cited

U.S. PATENT DOCUMENTS

| 9,537,476 | B1 | 1/2017 | Wadhwa et al. | |
| 9,647,618 | B1* | 5/2017 | Yuan | H03F 3/45197 |
| 11,381,427 | B1* | 7/2022 | Lin | H04L 25/0276 |
| 2019/0348949 | A1* | 11/2019 | Zhang | H03B 5/1852 |
| 2020/0028495 | A1 | 1/2020 | Song | |
| 2020/0321994 | A1* | 10/2020 | Alam | H04L 25/0272 |

OTHER PUBLICATIONS

International Search Report and Written Opinion—PCT/US2023/082836—ISA/EPO—May 8, 2024.

* cited by examiner

*Primary Examiner* — Metasebia T Retebo
(74) *Attorney, Agent, or Firm* — Loza & Loza, LLP

(57) ABSTRACT

An apparatus, including: a buffer configured to receive an input differential signal and generate an output signal based on the input differential signal, wherein the buffer includes a first buffer stage including: a first field effect transistor (FET); a second FET coupled in series with the first FET between a first voltage rail and a second voltage rail; a third FET; a fourth FET coupled in series with the third FET between the first voltage rail and the second voltage rail, wherein the first and third FETs include gates coupled together, and wherein the second and fourth FETs include gates configured to receive positive and negative components of the input differential signal; and a first capacitor coupled between a drain of the second FET and the gates of the first and third FETs.

21 Claims, 7 Drawing Sheets

BUFFER FOR VOLTAGE CONTROLLED OSCILLATOR (VCO) OR OTHER APPLICATIONS

FIELD

Aspects of the present disclosure relate generally to a signal buffer, and in particular, to a buffer for a standalone oscillator, voltage controlled oscillator (VCO), phase locked loop (PLL) VCO, and/or other applications.

BACKGROUND

An oscillator is used in many circuits for generating a periodic signal (e.g., sinewave or square wave), which is sometimes referred to as a clock or a clock signal. A buffer may be situated at an output of an oscillator for various reasons. For example, a buffer may prevent loading of the oscillator so that the load does not affect (e.g., change its target frequency and/or distort) the clock signal generated by the oscillator. Alternatively, or in addition to, a buffer may also amplify or boost the clock signal to achieve a certain amplitude suitable for use by one or more other circuits. Alternatively, or in addition to, a buffer may voltage level shift the clock signal from one voltage domain to another voltage domain.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus, includes: a buffer configured to receive an input differential signal and generate an output signal based on the input differential signal, wherein the buffer includes a first buffer stage including: a first field effect transistor (FET); a second FET coupled in series with the first FET between a first voltage rail and a second voltage rail; a third FET; a fourth FET coupled in series with the third FET between the first voltage rail and the second voltage rail, wherein the first and third FETs include gates coupled together, and wherein the second and fourth FETs include gates configured to receive positive and negative components of the input differential signal, respectively; and a first capacitor coupled between a drain of the second FET and the gates of the first and third FETs.

Another aspect of the disclosure relates to an apparatus. The apparatus includes: a phase locked loop (PLL) configured to generate a differential clock signal; and a buffer configured to receive the differential clock signal and generate an output clock signal based on the differential clock signal, wherein the buffer includes a first buffer stage including: a first field effect transistor (FET); a second FET coupled in series with the first FET between a first voltage rail and a second voltage rail; a third FET; a fourth FET coupled in series with the third FET between the first voltage rail and the second voltage rail, wherein the first and third FETs include gates coupled together, and wherein the second and fourth FETs include gates configured to receive positive and negative components of the differential clock signal, respectively; and a first capacitor coupled between a drain of the second FET and the gates of the first and third FETs.

Another aspect of the disclosure relates to a wireless communication device. The wireless communication device includes: at least one antenna; a transceiver coupled to the at least one antenna; one or more signal processing cores coupled to the transceiver; and a buffer coupled to the one or more signal processing cores, wherein the buffer includes: a first field effect transistor (FET); a second FET coupled in series with the first FET between a first voltage rail and a second voltage rail; a third FET; a fourth FET coupled in series with the third FET between the first voltage rail and the second voltage rail, wherein the first and third FETs include gates coupled together, and wherein the second and fourth FETs include gates configured to receive positive and negative components of a differential clock signal, respectively; and a capacitor coupled between a drain of the second FET and the gates of the first and third FETs.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
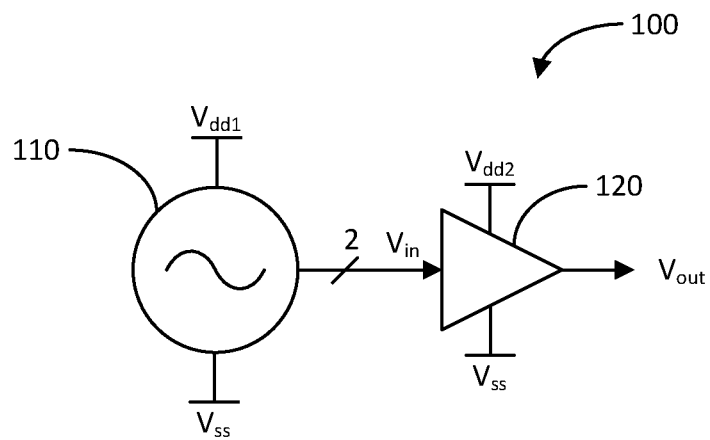
FIG. 1 illustrates a block diagram of an example apparatus including an oscillator and a buffer in accordance with an aspect of the disclosure.

FIG. 1 illustrates a block diagram of an example apparatus 100 including an oscillator 110 and a buffer 120 in accordance with an aspect of the disclosure. The oscillator 110 may be any type of oscillator, including a ring oscillator, inductor-capacitor (LC) oscillator, resistor-capacitor (RC) oscillator, or other type of oscillator. The oscillator 110 is configured to generate a clock signal $V_{in}$ (referred to as an input signal $V_{in}$ as it is provided to an input of the buffer 120).

The clock signal $V_{in}$ may be a substantially constant period or frequency signal (but may be controlled, as in the case of a voltage controlled oscillator (VCO), and/or frequency programmable (e.g., by changing a divider ratio in a feedback loop of a phase locked loop (PLL)). In this example, the clock signal $V_{in}$ is shown to be a differential or pseudo-differential signal ("2/"), but may be implemented as a single-ended signal. The oscillator 110 may operate under a first voltage domain between a first upper voltage rail $V_{dd1}$ and a lower voltage rail $V_{ss}$ (e.g., ground). The oscillator 110 may be a standalone oscillator, a VCO, as part of a PLL, or as part of a clock source for driving a computing component (e.g., central processing unit (CPU), graphics processing unit (GPU), digital signal processor (DSP), one or more cores of a system on chip (SOC), and others).

The buffer 120 is configured to receive the input clock signal $V_{in}$ from the oscillator 110 and generate therefrom an output clock signal $V_{out}$. For example, the buffer 120, which may also be referred to as an amplifier, may amplify or boost the input clock signal $V_{in}$ to generate the output clock signal $V_{out}$. The buffer 120 may also operate under a different voltage domain than the oscillator 110. For example, the buffer 120 may operate under a second voltage domain, such as between a second upper voltage rail $V_{dd2}$ and the lower voltage rail $V_{ss}$. In such case, the buffer 120, which may also be referred to as a voltage level shifter, may level shift the input clock signal $V_{in}$ from the first voltage domain ($V_{dd1}$/$V_{ss}$) to generate the output clock signal $V_{out}$ in the second voltage domain ($V_{dd2}$/$V_{ss}$).

Some target characteristics of the buffer 120 may include generating the output clock signal $V_{out}$ so that it has substantially full rail swing, such as between $V_{dd2}$ and $V_{ss}$. Another target characteristic of the buffer 120 is that it should not introduce significant duty cycle distortion in the output clock signal $V_{out}$, or may improve upon the duty cycle of the input clock signal $V_{in}$ generated by the oscillator 110. Thus, the output clock signal $V_{out}$ should approach substantially 50 percent (%) duty cycle.

Figure 2A:
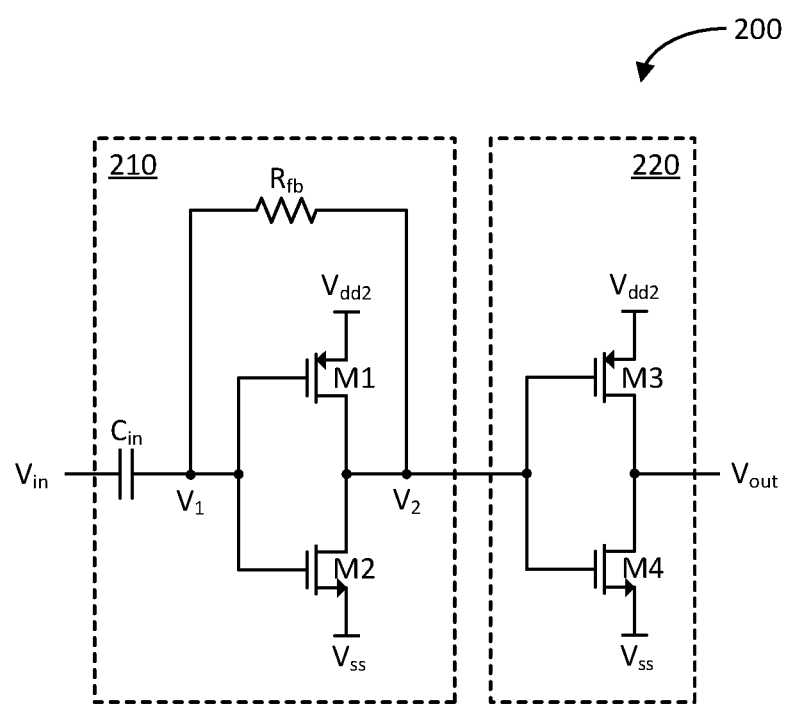
FIG. 2A illustrates a schematic diagram of an example buffer in accordance with another aspect of the disclosure.

FIG. 2A illustrates a schematic diagram of an example buffer 200 in accordance with another aspect of the disclosure. The buffer 200 may be an example detailed implementation of the buffer 120 previously discussed. The buffer 200 includes a first or input buffer stage 210 and a second or output buffer stage 220. The input buffer 210 is configured to amplify an input signal $V_{in}$ (e.g., the clock signal generated by the oscillator 110), and the output buffer stage 220 is configured to ensure that an output signal $V_{out}$ (e.g., the output clock signal of buffer 120) has substantially full rail-to-rail swing.

More specifically, the input buffer stage 210 includes an alternating circuit (ac)-coupled first field effect transistor (FET) M1 (e.g., a p-channel metal oxide semiconductor FET or PMOS FET) by way of input capacitor $C_{in}$, a second FET M2 (e.g., an n-channel metal oxide semiconductor FET or NMOS FET), and a feedback resistor $R_{fb}$. The first and second FETs M1 and M2 are coupled in series between an upper voltage rail $V_{dd2}$ and a lower voltage rail $V_{ss}$ (e.g., ground). That is, the first FET M1 includes a source coupled to the upper voltage rail $V_{dd2}$, a gate coupled to a gate of the second FET M2, and a drain coupled to a drain of the second FET M2. The second FET M2 includes a source coupled to the lower voltage rail $V_{ss}$.

The ac-coupled capacitor $C_{in}$ is coupled between an input of the buffer 200 and the gates of the first and second FETs M1 and M2. The feedback resistor $R_{fb}$ is coupled between the drains and gates of the first and second FETs M1 and M2. The ac-coupled capacitor $C_{in}$ blocks the direct current (dc) component while passing through the ac component of the input signal $V_{in}$ to the gates of the FETs M1 and M2 as a first signal $V_1$. The combination of the FETs M1 and M2 and feedback resistor $R_{fb}$ amplifies the first signal V to generate a second signal V at the drains of the FETs M1 and M2. The FETs M1 and M2 are sized and biased substantially the same where the dc component of the second signal $V_2$ is around $V_{dd2}/2$ and the ac component of the second signal $V_2$ has substantially a 50% duty cycle.

The output buffer stage 220 is essentially implemented as an inverter configured to invert the second signal $V_2$ to generate the output signal $V_{out}$. That is, the output buffer stage 220 includes a third FET M3 (e.g., a PMOS FET) coupled in series with a fourth FET M4 (e.g., an NMOS FET) between the upper voltage rail $V_{dd2}$ and the lower voltage rail $V_{ss}$. That is, the third FET M3 includes a source coupled to the upper voltage rail $V_{dd2}$, a gate coupled to a gate of the fourth FET M4 and to the drains of the first and second FETs M1 and M2, and a drain coupled to a drain of the fourth FET M4. The fourth FET M4 includes a source coupled to the lower voltage rail $V_{ss}$.

The ac gain associated with the input buffer stage 210 is a function of (e.g., directly related to) the resistance of the feedback resistor $R_{fb}$ and the size or current-carrying capability of the FETs M1 and M2. Generally, to achieve a certain ac gain, a reasonable range for the resistance of the feedback resistor $R_{fb}$ is in the 10s of kiloohms (kΩ) range (e.g., 50 kΩ). Given a particular resistance for the feedback resistor $R_{fb}$, if higher ac gain is desired for the input buffer stage 210, the size of the FETs M1 and M2 may be increased to increase the current flowing through these devices. Thus, one drawback of the buffer 200 is that higher ac gain translates to higher power consumption (e.g., in other words, ac gain and power consumption are strongly coupled in buffer 200). So, if the ac gain of the buffer 200 is set for a slow-slow (SS), low temperature (e.g., −40 degrees Celsius (° C.)) process corner, the buffer 200 may consume substantial power with the higher ac gain associated with a fast-fast (FF), high temperature (e.g., 125° C.) process corner.

Another issue with the buffer 200 is its susceptibility to supply voltage noise. As previously discussed, the dc component of the second signal $V_2$ is set to be about $V_{dd2}/2$. Thus, the second signal $V_2$ varies in accordance with noise on the supply voltage $V_{dd2}$. Via the feedback resistor $R_{fb}$, the dc component of the first signal $V_1$ at the gates of FETs M1 and M2 also varies in accordance with noise on the supply voltage $V_{dd2}$. Further, the threshold voltage of FETs M1 and M2 similarly varies with the supply voltage $V_{dd2}$. However, due to the time constant formed by the feedback resistor $R_{fb}$ (relatively large for ac gain) and the input capacitor $C_{in}$ (and some additional parasitic), the variation of the first signal $V_1$ lags the variation of the threshold voltage of FETs M1 and M2 with variation of the supply voltage $V_{dd2}$. Due to this lag, the buffer 200 is susceptible to generating the output signal $V_{out}$ with distortion, including missing pulses and glitches.

Figure 2B:
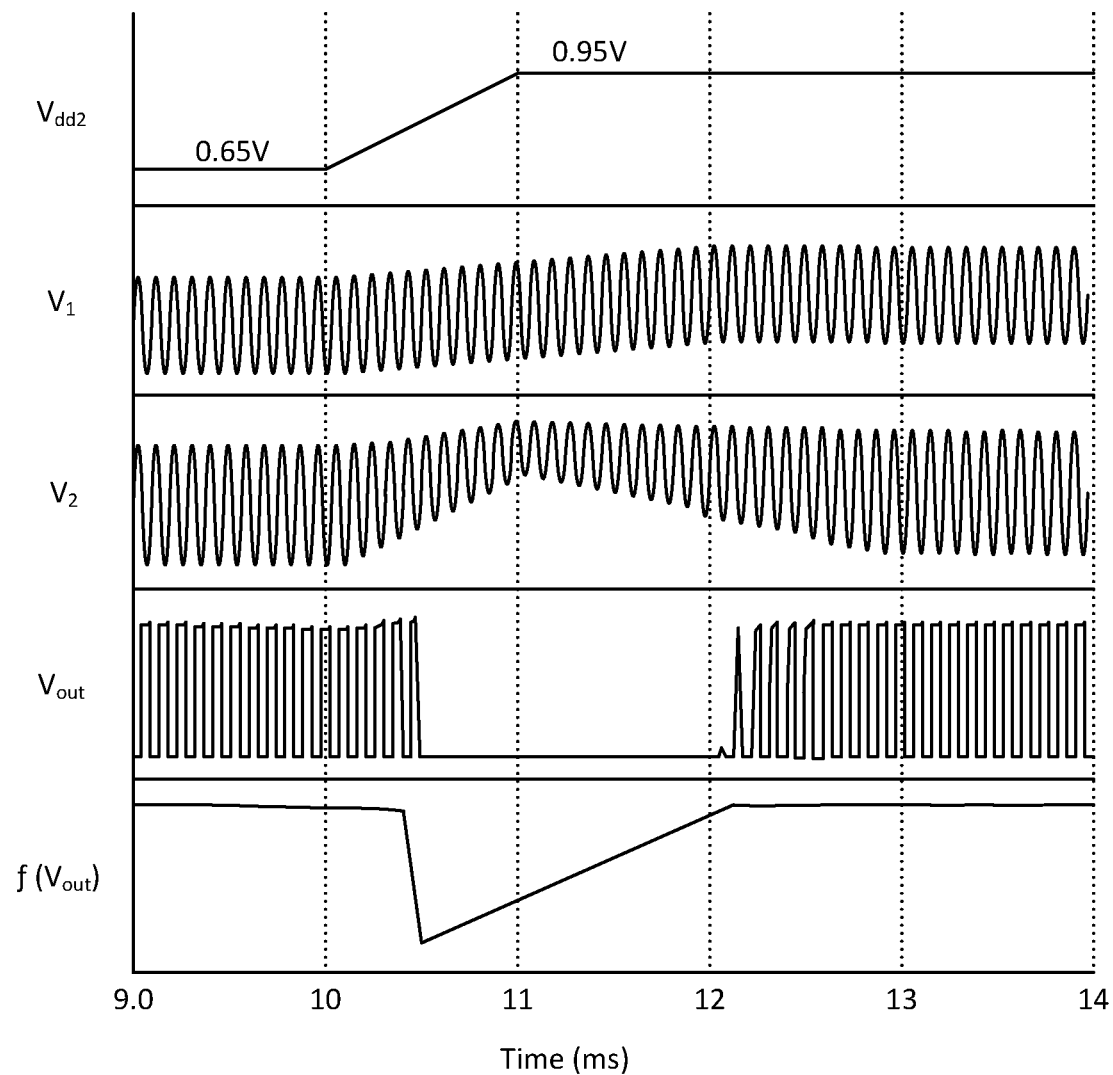
FIG. 2B illustrates a graph depicting signals related to the example buffer of FIG. 2A in accordance with another aspect of the disclosure.

FIG. 2B illustrates a graph depicting signals related to the example buffer 200 in accordance with another aspect of the disclosure. The x- or horizontal axis of the graph represents time extending from 9.0 milliseconds (ms) to 14 ms. The y- or vertical axis of the graph, from top to bottom, represents the supply voltage $V_{dd2}$, the first signal $V_1$, the second signal $V_2$, the output signal $V_{out}$, and the frequency $f(V_{out})$ of the output signal $V_{out}$, respectively.

As the graph illustrates, during time interval 9.0 to 10 ms, the supply voltage $V_{dd2}$ is substantially steady at 0.65 Volt (V). As a result, the first signal $V_1$, which is comprised of the ac component of the input signal $V_{in}$ and the dc component derived from Vdd/2 through the feedback resistor $R_{fb}$, is also cycling in accordance with the periodic input clock signal $V_{in}$. Similarly, the second signal $V_2$ is also cycling in accordance with the first signal $V_1$ but with a larger amplitude based on the ac gain provided by the input buffer stage 210. The output buffer stage 220 inverts the second signal e $V_2$ to generate the output signal $V_{out}$, which cycles in accordance the second signal $V_2$ but with substantially rail-to-rail swing.

Beginning at time 10 ms, in this example, the supply voltage $V_{dd2}$ experiences noise in the form of a linear rising drift from 0.65V at 10 ms to 0.95V at 11 ms. Note that the rise in the first signal $V_1$ in response to the rise in the supply voltage $V_{dd2}$ lags due to the time constant associated with the feedback resistor $R_{fb}$ and the input capacitor $C_{in}$. For example, the supply voltage $V_{dd2}$ rises for a length of 1 ms, whereas the first signal $V_1$ rises for a length of 2 ms. However, as discussed, the threshold voltage of the FETs M1 and M2 responsively rises with the supply voltage $V_{dd2}$ with substantially no lag. As a result, the second signal $V_2$ begins to distort with its negative peaks rising faster than its positive peaks during time interval 10-11 ms, and its negative peaks falling faster than its positive peaks during time interval 11-13 ms.

Thus, during time interval 10.5-12.5 ms while the second signal $V_2$ is distorted, the output buffer stage 220 is not able to generate a proper output signal $V_{out}$. As shown, during such time interval, the output signal $V_{out}$ includes missing pulses, glitches, and distorted pulses. Further, due to the missing pulses, during the time interval 10.5-12.5 ms, the frequency $f(V_{out})$ of the output signal $V_{out}$ decreases rapidly and slowly recovers.

Figure 3A:
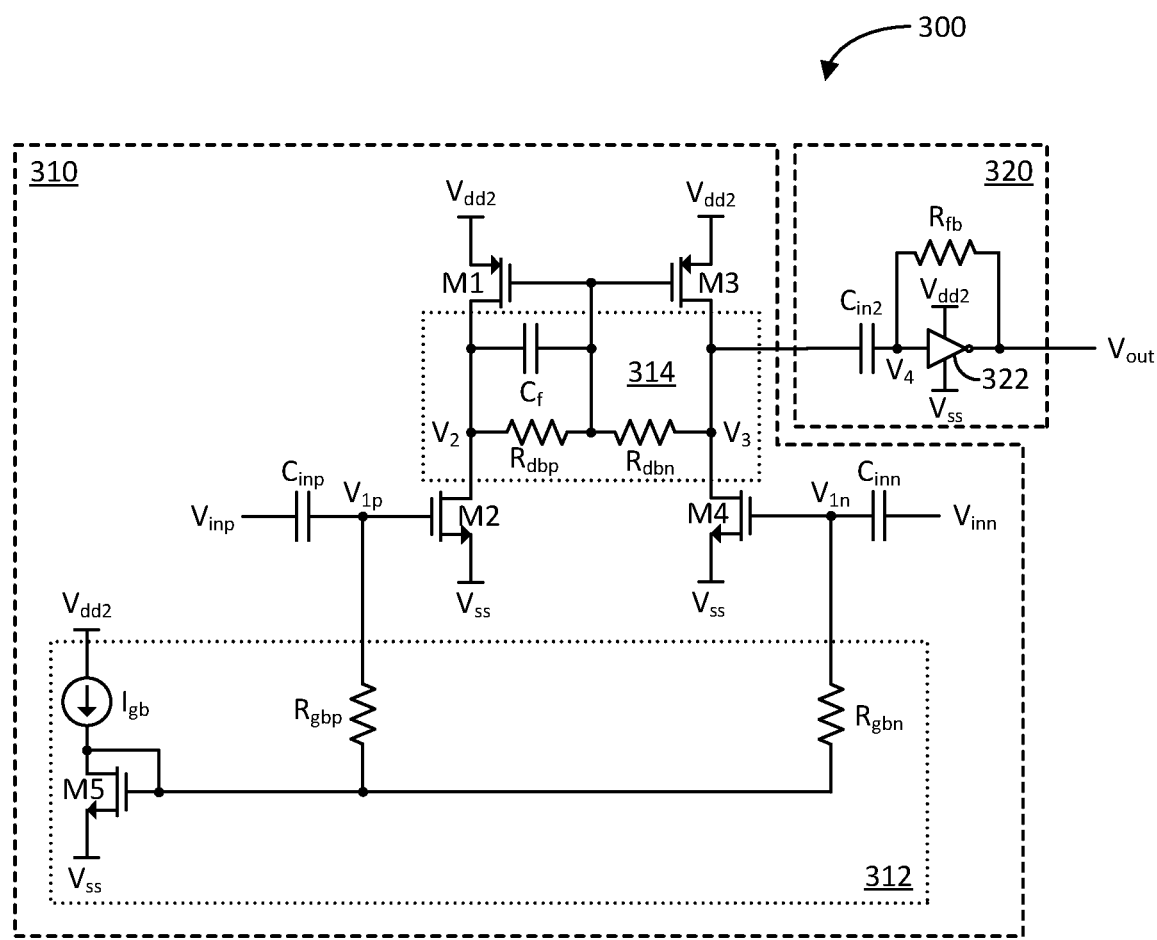
FIG. 3A illustrates a schematic diagram of another example buffer in accordance with another aspect of the disclosure.

FIG. 3A illustrates a schematic diagram of another example buffer 300 in accordance with another aspect of the disclosure. The buffer 300 may be an example detailed implementation of the buffer 120 previously discussed. The buffer 300 includes a first input buffer stage 310 and a second output buffer stage 320. The input buffer stage 310 is configured to amplify an input differential signal $V_{in}$ (e.g., the clock signal generated by the oscillator 110), and the output buffer stage 320 is configured to ensure that an output signal $V_{out}$ (e.g., the output signal of buffer 120) has substantially full rail-to-rail swing.

The input buffer stage 310 includes a first FET M1 (e.g., a PMOS FET) coupled in series with a second FET M2 (e.g., an NMOS FET) between an upper voltage rail $V_{dd2}$ and a lower voltage rail $V_{ss}$ (e.g., ground). That is, the first FET M1 includes a source coupled to the upper voltage rail $V_{dd2}$ and a drain coupled to a drain of the second FET M2. The second FET M2 includes a source coupled to the lower voltage rail $V_{ss}$. The input buffer stage 310 further includes a third FET M3 (e.g., a PMOS FET) coupled in series with a fourth FET M4 (e.g., an NMOS FET) between the upper voltage rail $V_{dd2}$ and the lower voltage rail $V_{ss}$. That is, the third FET M3 includes a source coupled to the upper voltage rail $V_{dd2}$ and a drain coupled to a drain of the fourth FET M4. The fourth FET M4 includes a source coupled to the lower voltage rail $V_{ss}$. The FETs M1-M4 may be part of a pseudo-differential stage, where the sources of FETs M2 and M4 are coupled to the lower voltage rail $V_{ss}$ without going through a current source.

The second (ac-coupled) FET M2 includes a gate configured to receive a positive component $V_{inp}$ of the input differential signal $V_{in}$ via an input capacitor $C_{inp}$. Similarly, the fourth (ac-coupled) FET M4 includes a gate configured to receive a negative component $V_{inn}$ of the input differential signal $V_{in}$ via an input capacitor $C_{inn}$. The input buffer stage 310 further includes a filter 314 including a first drain bias resistor $R_{dbp}$ coupled in series with a second drain bias resistor $R_{dbn}$ between the drains of the first/second M1/M2 and third/fourth FETs M3/M4, respectively. A node between the resistors $R_{dbp}$ and $R_{dbn}$ is coupled to gates of the first and third FETs M1 and M3. The filter 314 further includes a capacitor $C_f$ coupled between the drains of the first and second FETs M1 and M2 and the gates of the first and third FETs M1 and M3.

The input buffer stage 310 further includes a gate bias circuit 312 including a current source $I_{gb}$ coupled in series with a fifth FET M5 (e.g., an NMOS FET) between the upper voltage rail $V_{dd2}$ and the lower voltage rail $V_{ss}$. The fifth FET M5 may be a replica of or matched (e.g., same size) with each of the second and fourth FETs M2 and M4. The fifth FET M5 is diode-connected including drain and gate coupled together, and a source coupled to the lower voltage rail $V_{ss}$. The gate bias circuit 312 further includes gate bias resistors $R_{gbp}$ and $R_{gbn}$. The gate of the second FET M2 is coupled to the drain/gate of the diode-connected fifth FET M5 via the gate bias resistor $R_{gbp}$. Similarly, the gate of the fourth FET M4 is coupled to the drain/gate of the diode-connected fifth FET M5 via the gate bias resistor $R_{gbn}$.

The output buffer stage 320 includes an inverter 322 and a feedback resistor $R_{fb}$ coupled between an output and input of the inverter 322. The inverter 322 may be coupled between the upper voltage rail $V_{dd2}$ and the lower voltage rail $V_{ss}$. The output buffer stage 320 further includes an input capacitor $C_{in2}$ coupled between the drains of FETs M3/M4 and the input of the inverter 322. The output buffer stage 320 may be configured similar to the input buffer stage 210 of the buffer 200.

In operation, the input capacitors $C_{inp}$ and $C_{inn}$ remove or block the dc components from the positive and negative components $V_{inp}$ and $V_{inn}$ of the input differential signal $V_{in}$, respectively. Further, the gate bias circuit 312 provide dc bias voltages for the gates of the second and fourth FETs M2 and M4, respectively. For example, the gate bias circuit 312 may be configured to bias the gates of the second and fourth FETs M2 and M4 to substantially their threshold voltages or saturation regions. Thus, the gates of the second and fourth FETs M2 and M4 have gate signals $V_{1p}$ and $V_{1n}$ being combinations of the ac components of the positive and negative components $V_{inp}$ and $V_{inn}$ of the input differential signal $V_{in}$ and the dc bias voltages provided by the gate bias circuit 312, respectively. In this configuration, the dc component of the input differential signal $V_{in}$ does not affect the biasing of the FETs M2 and M4, which may be set by the gate bias circuit 312 as desired.

The resistors $R_{dbp}$ and $R_{dgn}$ of the filter 314 provide dc stability to the input buffer stage 310 including setting the dc or common mode voltages at the drains of the first/second FETs M1/M2 and drains of the third and fourth FETs M3/M4, respectively. The resistors $R_{dbp}$ and $R_{dgn}$ may have substantially the same resistance to achieve 50% duty cycle of the signals $V_2$ and $V_3$ produced by the input buffer stage 310. The capacitor $C_f$ of the filter 314, which operates essentially as a high pass filtering component, feeds forward the positive-side ac component at the drains of FETs M1/M2 to the gate of FET M3. Thus, the drains of FETs M1 and M2 have a second signal $V_2$ being a combination of the common mode voltage established by resistor $R_{dbp}$ and the positive-side ac component formed by the operation of FET M2 in response to its gate voltage $V_{1p}$.

The FETs M3/M4 operate as the main ac gain components with the positive-side ac signal applied to the gate of FET M3 via the feedforward capacitor $C_f$ and the negative-side ac signal applied to the drain of FET M3 via FET M4 producing a push-pull effect on FET M3. Thus, the drains of FETs M3 and M4 produce a third signal $V_3$ being a combination of the common mode voltage established by resistor $R_{dbn}$ and the amplified ac component of the input differential signal $V_{in}$. As the FET M3 may operate as a diode-connected FET (e.g., its gate and drain are coupled together via resistor $R_{dbn}$), the voltage $V_3$ at the drains of FETs M3 and M4 varies responsively with the ac component or noise on the supply voltage $V_{dd2}$.

Further, as the FETs M1-M4 form a pseudo-differential stage with the sources of FETs M2 and M4 coupled directly to the lower voltage rail Vss, the current through the pseudo-differential stage is not limited by a tail current source. As such, the duty cycle of the ac component of the signals $V_2$ and $V_3$ is not impacted by current limiting effects of a tail current source, which may otherwise have the adverse effect of impacting the substantially 50% duty cycle of the signals $V_2$ and $V_3$.

As the input buffer stage 310 serves to provide most of the ac signal amplification for the buffer 300, the output buffer stage 320 may be configured to provide a relatively small ac gain to achieve rail-to-rail swing for the output signal $V_{out}$. Accordingly, the size (e.g., FETs) of the inverter 322 and resistance of the feedback resistor $R_{fb}$ may be made smaller as the output buffer stage 320 need not provide a relatively large ac gain. This improves the power efficiency of the buffer 300 as, for example, the shoot-through current produced by the inverter 322 may be substantially smaller.

The input capacitor $C_{in2}$, coupled between the output (drains of FETs M3/M4) of the input buffer stage 310 and the input of the inverter 322, removes or blocks the common mode voltage and allows through the amplified ac signal component and the ac component (noise) of the supply voltage $V_{dd2}$ present in the third signal $V_3$ to form a fourth signal $V_4$ at the input of the inverter 322. As the ac component (noise) of the supply voltage $V_{dd2}$ is present in $V_4$, the fourth signal $V_4$ also varies responsively with the supply voltage $V_{dd2}$ and tracks changes in the threshold voltage of the transistors in the inverter 322 due to the supply voltage $V_{dd2}$. This prevents distortion, such as missing pulses or glitches, from occurring in the output signal $V_{out}$.

Figure 3B:
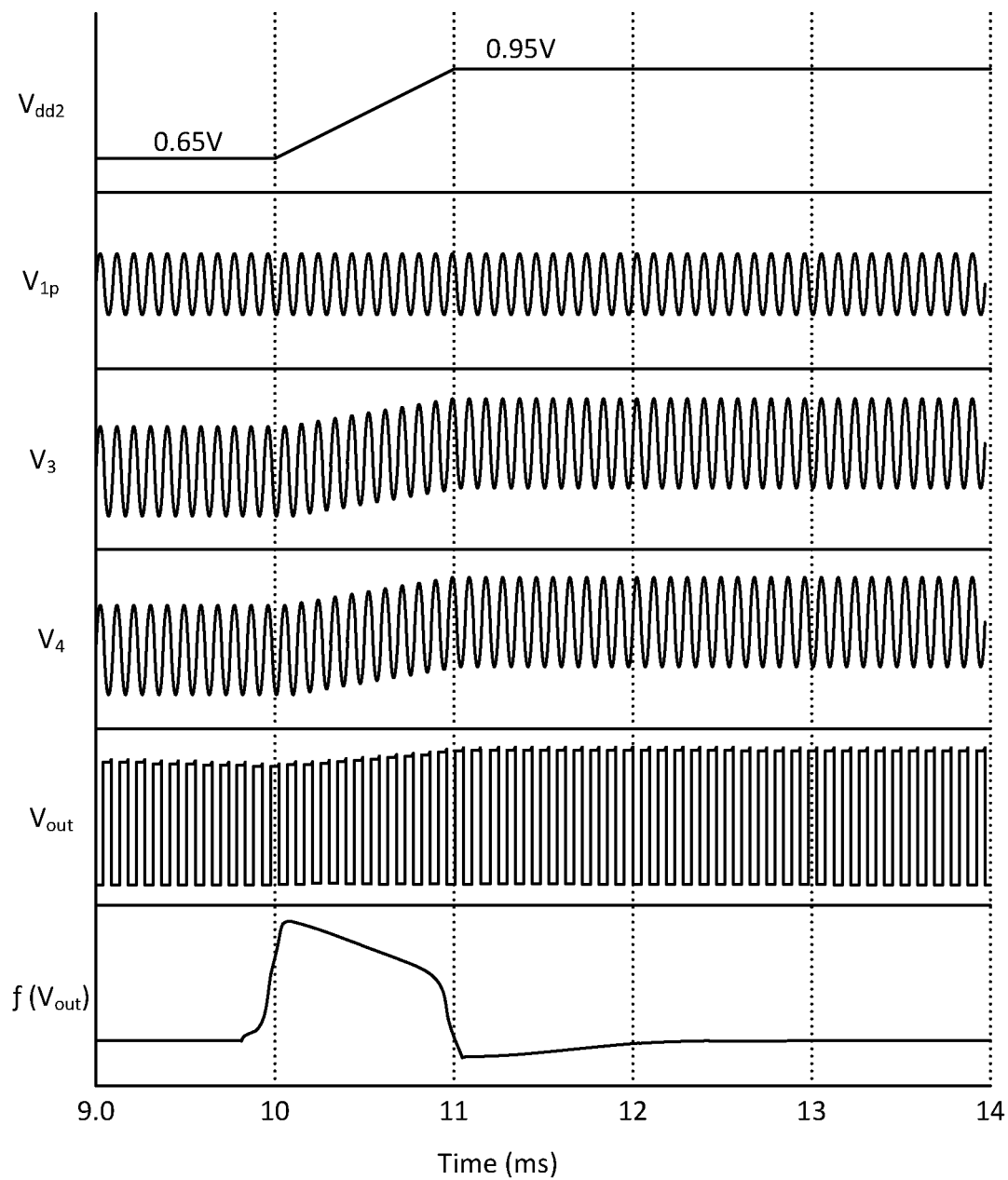
FIG. 3B illustrates a graph depicting signals related to the example buffer of FIG. 3A in accordance with another aspect of the disclosure.

FIG. 3B illustrates a graph depicting signals related to the example buffer 300 in accordance with another aspect of the disclosure. The x- or horizontal axis of the graph represents time extending from 9.0 to 14 ms. The y- or vertical axis of the graph, from top to bottom, represents the supply voltage $V_{dd2}$, the signal $V_{1p}$ at the gate of FET M2, the third signal $V_3$, the fourth signal $V_4$, the output signal $V_{out}$, and the frequency $f(V_{out})$ of the output signal $V_{out}$, respectively.

As the graph illustrates, during time interval 9.0 to 10 ms, the supply voltage $V_{dd2}$ is substantially steady at 0.65 Volt (V). The gate signal $V_{1p}$ cycles in accordance with the positive component $V_{inp}$ of the input differential signal $V_{in}$. Similarly, the third signal $V_3$ is also cycling in accordance with the gate signal $V_{1p}$, but with a larger amplitude based on the ac gain provided by the input buffer stage 310. The fourth signal $V_4$ cycles with substantially the same amplitude as the third signal $V_3$. The output buffer stage 320 inverts the fourth signal $V_4$ with an ac gain to generate the output signal $V_{out}$ cycling with substantially rail-to-rail swing.

Beginning at time 10 ms, in this example, the supply voltage $V_{dd2}$ experiences noise in the form of a linear rising drift from 0.65V at 10 ms to 0.95V at 11 ms. In this case, the gate signal $V_{1p}$ remains substantially unaffected by the noise on the supply voltage $V_{dd2}$ as its dc component is set by the gate bias circuit 312. As discussed, the dc component or common mode voltage of the third signal $V_3$ responsively changes (e.g., increases) in accordance with the noise on the supply voltage $V_{dd2}$. Similarly, the dc component of the fourth signal $V_4$ also substantially tracks the noise on the supply voltage $V_{dd2}$ as the time constant associated with the input capacitor $C_{in2}$ and feedback resistor $R_{fb}$ is relatively small. The output buffer stage 320 inverts the fourth signal $V_4$ with an ac gain to generate the output signal $V_{out}$ cycling with substantially rail-to-rail swing.

Note, due to the responsive tracking of the supply voltage $V_{dd2}$ by the third and fourth signals $V_3$ and $V_4$ in line with the threshold voltage of the internal FETs of inverter 322, the output signal $V_{out}$ is substantially immune from distortion (e.g., missing pulses and glitches) as a result of the noise on the supply voltage $V_{dd2}$. Also, during the time interval 10-11 ms at which the noise is changing the supply voltage $V_{dd2}$, there is a slight disturbance of the frequency $f(V_{out})$ of the output signal $V_{out}$, but the frequency does not go down to zero Hertz (Hz) as there are no missing pulses or glitches that may significantly affect the frequency.

Figure 3C:
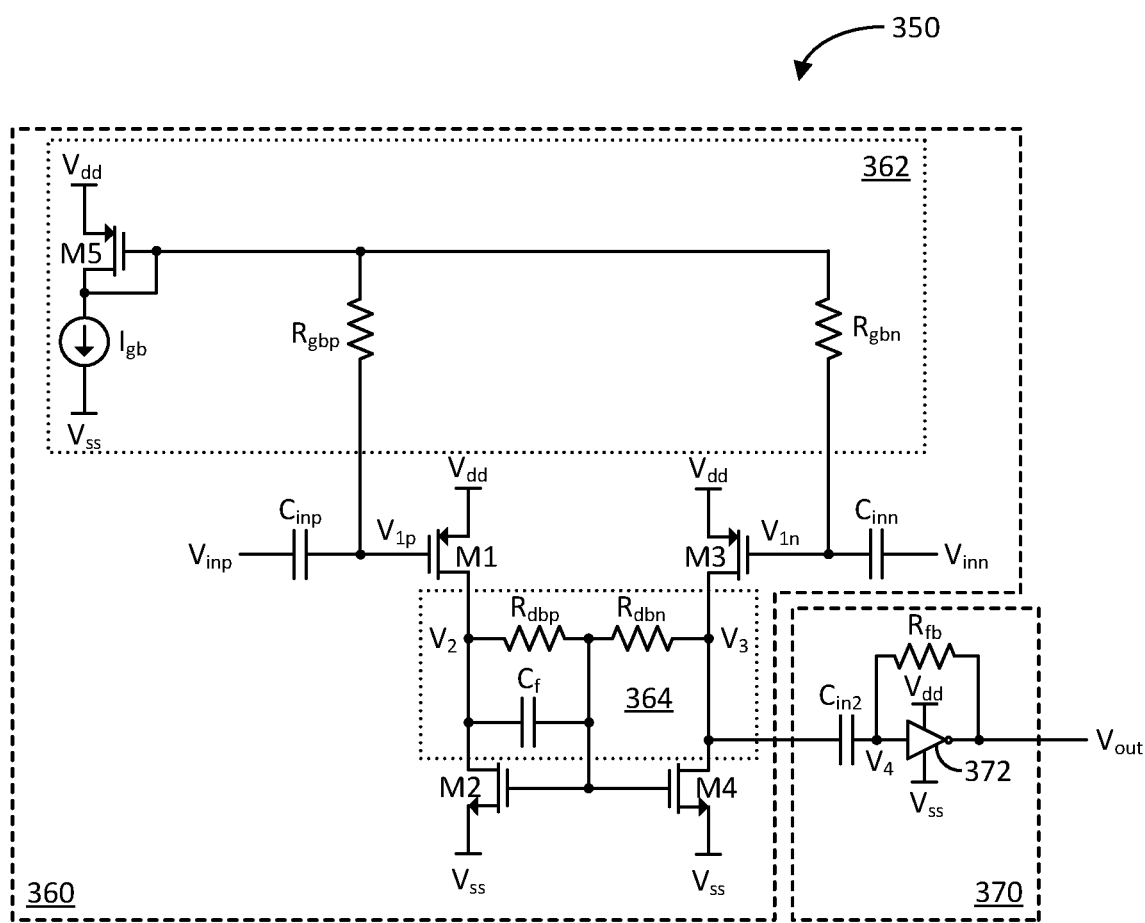
FIG. 3C illustrates a schematic diagram of another example buffer in accordance with another aspect of the disclosure.

FIG. 3C illustrates a schematic diagram of another example buffer 350 in accordance with another aspect of the disclosure. The buffer 350 is a variation of buffer 300, and configured to amplify an input differential signal $V_{in}$ to generate an output signal $V_{out}$ in a manner that is more immune to noise that may be present in a lower voltage rail $V_{ss}$ (e.g., ground noise). The buffer 350 is essentially a vertically-flipped version of the buffer 300, with the PMOS FETs and NMOS FETs switched in the flipped configuration.

The buffer 350 includes a first input buffer stage 360 and a second output buffer stage 370. The input buffer stage 360 is configured to amplify the input differential signal $V_{in}$ (e.g., the clock signal generated by the oscillator 110), and the output buffer stage 370 is configured to ensure that the output signal $V_{out}$ (e.g., the output signal of buffer 120) has substantially full rail-to-rail swing.

The input buffer stage 360 includes a first FET M1 (e.g., a PMOS FET) coupled in series with a second FET M2 (e.g., an NMOS FET) between an upper voltage rail $V_{dd}$ and a lower voltage rail $V_{ss}$ (e.g., ground). That is, the first FET M1 includes a source coupled to the upper voltage rail $V_{dd}$ and a drain coupled to a drain of the second FET M2. The second FET M2 includes a source coupled to the lower voltage rail $V_{ss}$. The input buffer stage 360 further includes a third FET M3 (e.g., a PMOS FET) coupled in series with a fourth FET M4 (e.g., an NMOS FET) between the upper voltage rail $V_{dd}$ and the lower voltage rail $V_{ss}$. That is, the third FET M3 includes a source coupled to the upper voltage rail $V_{dd}$ and a drain coupled to a drain of the fourth FET M4. The fourth FET M4 includes a source coupled to the lower voltage rail $V_{ss}$. The FETs M1-M4 may be part of a pseudo-differential stage, where the sources of FETs M1 and M3 are coupled to the upper voltage rail $V_{dd}$ without going through a current source.

The first (ac-coupled) FET M1 includes a gate configured to receive a positive component $V_{inp}$ of the input differential signal $V_{in}$ via an input capacitor $C_{inp}$. Similarly, the third (ac-coupled) FET M3 includes a gate configured to receive a negative component $V_{inn}$ of the input differential signal $V_{in}$ via an input capacitor $C_{inn}$. The input buffer stage 360 further includes a filter 364 including a first drain bias resistor $R_{dbp}$ coupled in series with a second drain bias resistor $R_{dbn}$ between the drains of the first/second M1/M2 and third/fourth FETs M3/M4, respectively. A node between the resistors $R_{dbp}$ and $R_{dbn}$ is coupled to gates of the second and fourth FETs M2 and M4. The filter 364 further includes a capacitor $C_f$ coupled between the drains of the first and second FETs M1 and M2 and the gates of the second and fourth FETs M2 and M4.

The input buffer stage 360 further includes a gate bias circuit 362 including a fifth FET M5 (e.g., a PMOS FET) coupled in series with a current source $I_{gb}$ between the upper voltage rail $V_{dd}$ and the lower voltage rail $V_{ss}$. The fifth FET M5 may be a replica of or matched (e.g., same size) with each of the first and third FETs M1 and M3. The fifth FET M5 is diode-connected including drain and gate coupled together, and a source coupled to the upper voltage rail $V_{dd}$. The gate bias circuit 362 further includes gate bias resistors $R_{gbp}$ and $R_{gbn}$. The gate of the first FET M1 is coupled to the drain/gate of the diode-connected fifth FET M5 via the gate bias resistor $R_{gbp}$. Similarly, the gate of the third FET M3 is coupled to the drain/gate of the diode-connected fifth FET M5 via the gate bias resistor $R_{gbn}$.

The output buffer stage 370 includes an inverter 372 and a feedback resistor $R_{fb}$ coupled between an output and input of the inverter 372. The inverter 372 may be coupled between the upper voltage rail $V_{dd}$ and the lower voltage rail $V_{ss}$. The output buffer stage 370 further includes an input capacitor $C_{in2}$ coupled between the drains of FETs M3/M4 and the input of the inverter 372. The output buffer stage 370 may be configured similar to the input buffer stage 210 of the buffer 200. The operation of the buffer 350 is similar to the operation of the buffer 300, as previously discussed in detail.

Figure 4:
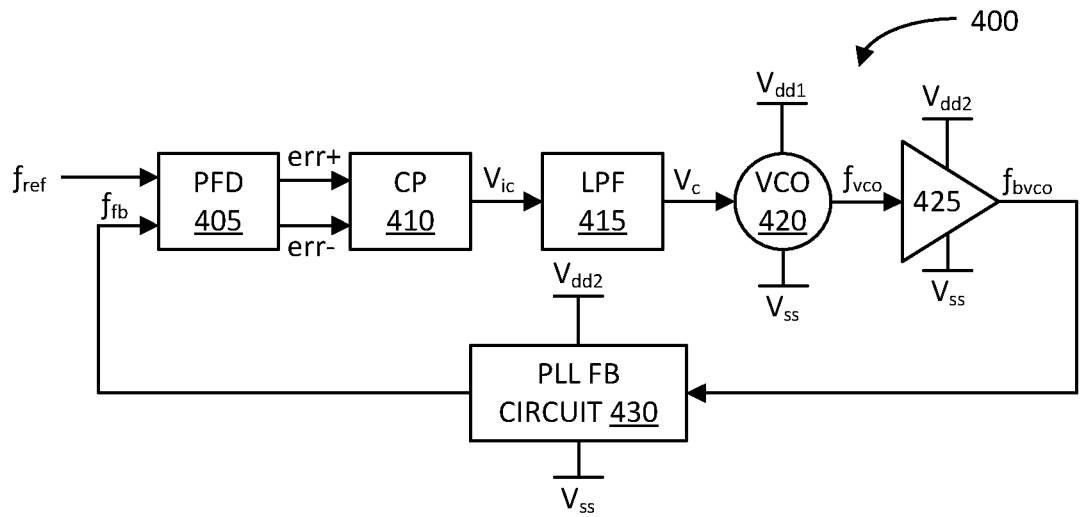
FIG. 4 illustrates a block diagram of an example phase lock loop (PLL) in accordance with another aspect of the disclosure.

FIG. 4 illustrates a block diagram of another example phase lock loop (PLL) 400 in accordance with another aspect of the disclosure. The PLL 400 includes a phase-frequency detector (PFD) 405, a charge pump (CP) 410, a low pass filter (LPF) 415, a voltage controlled oscillator (VCO) 420, a buffer 425, and a PLL feedback (FB) circuit 430.

The PFD 405 is configured to generate a phase-frequency error signal err+/err− based on a phase-frequency difference between a reference signal $f_{ref}$ and a feedback signal $f_{fb}$. For example, if the phase-frequency of the feedback signal $f_{fb}$ lags the phase-frequency of the reference signal $f_{ref}$, the PFD 405 may assert the err+ and deassert the err−. Conversely, if the phase-frequency of the feedback signal $f_{fb}$ leads the phase-frequency of the reference signal $f_{ref}$, the PFD 405 may deassert the err+ and assert the err−.

The CP 410 is configured to generate an intermediate control signal $V_{ic}$ based on the phase-frequency error signal err+/err−. For example, if the err+ is asserted and err− is deasserted, the CP 410 may charge an internal capacitor to increase the intermediate control signal $V_{ic}$. Conversely, if the err+ is deasserted and err− is asserted, the CP 410 may discharge the internal capacitor to decrease the intermediate control signal $V_{ic}$. The LPF 515 low pass filters (e.g., substantially removes high frequency components in) the intermediate control signal $V_{ic}$ to generate a control signal $V_c$ that controls a frequency of a VCO signal $f_{vco}$ generated by the VCO 420.

The buffer 425, which may be implemented per buffer 300 previously discussed, may amplify or boost, and optionally, voltage level shift, the VCO signal $f_{vco}$ to generate a buffered VCO signal $f_{bvco}$. With regard to level shifting, the VCO 420 may operate in accordance with a first voltage domain between a first upper voltage rail $V_{dd1}$ and a lower voltage rail $V_{ss}$ (e.g., ground). Thus, the VCO signal $f_{vco}$ may swing substantially between $V_{dd1}$ and $V_{ss}$ in accordance with the first voltage domain. Accordingly, in addition to amplifying or boosting the VCO signal $f_{vco}$, the buffer 425 may level shift the VCO signal $f_{vco}$ to a second voltage domain between $V_{dd2}$ and $V_{ss}$ to generate the buffered VCO signal $f_{bvco}$. As such, the buffer 425 may be coupled between a second upper voltage rail $V_{dd2}$ and the lower voltage rail $V_{ss}$. As an example, the first voltage domain $V_{dd1}/V_{ss}$ may be set to more optimally operate the VCO 420, and the second voltage domain $V_{dd2}/V_{ss}$ may correspond to core circuits of an associated integrated circuit (IC), such as a system on chip (SOC).

The PLL FB circuit 430 is configured to generate the feedback signal $f_{fb}$ by frequency dividing the buffered VCO signal $f_{bvco}$. For example, the PLL FB circuit 430 may include one or more cascaded frequency dividers. The one or more cascaded frequency dividers may include a programmable and/or fractional frequency divider. In such case, the PLL FB circuit 430 may include associated circuitry, such as a delta-sigma modulator for controlling the fractional division of the buffered VCO signal $f_{bvco}$. As the PLL FB circuit 430 may frequency divide the buffered VCO signal $f_{bvco}$, which is in the second voltage domain, the PLL FB circuit 430 may operate in accordance with the second voltage domain between the second upper voltage rail $V_{dd2}$ and the lower voltage rail $V_{ss}$.

Figure 5:
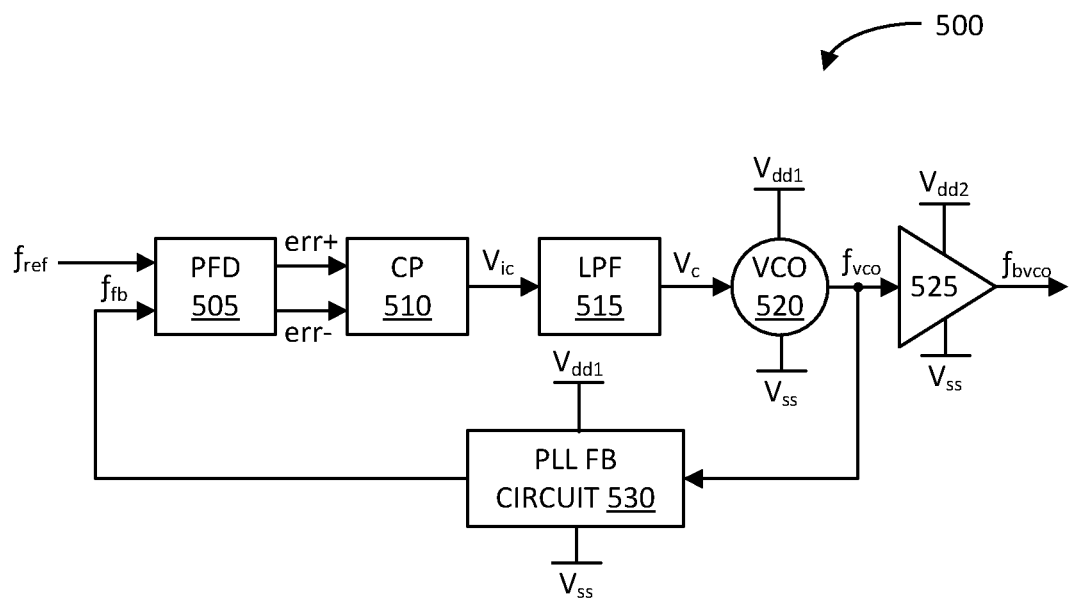
FIG. 5 illustrates a block diagram of another example phase lock loop (PLL) in accordance with another aspect of the disclosure.

FIG. 5 illustrates a block diagram of another example phase lock loop (PLL) 500 in accordance with another aspect of the disclosure. The PLL 500 is a variation of the PLL 400 previously discussed, and includes many same/similar elements as indicated by the same reference numbers with the exception that the most significant digit is a "5" in PLL 500 instead of a "4" in PLL 400. A difference between the PLLs 400 and 500 is that the VCO signal $f_{vco}$ is provided to the PLL FB circuit 530 instead of the buffered VCO signal $f_{vco}$. In such case, the PLL FB circuit 530 may operate in accordance with the first voltage domain ($V_{dd1}/V_{ss}$), whereas the PLL FB circuit 430 of PLL 400 operates in accordance with the second voltage domain ($V_{dd2}/V_{ss}$). The first voltage domain may be more suitable under which the PLL 500 may operate, where the performance of the PLL 500 is improved over the PLL 400 that operates under two different voltage domains (e.g., $V_{dd1}$ and $V_{dd2}$).

Figure 6:
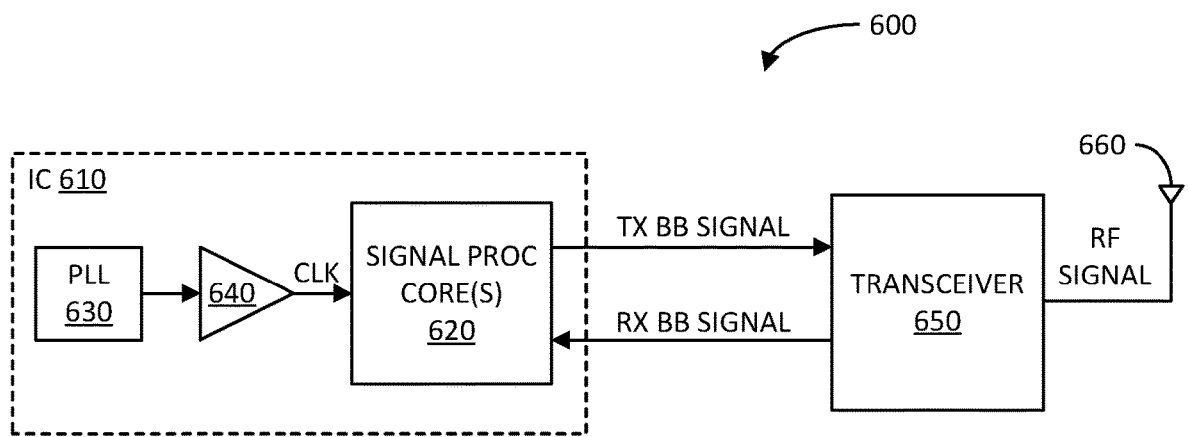
FIG. 6 illustrates a block diagram of an example wireless communication device in accordance with another aspect of the disclosure.

FIG. 6 illustrates a block diagram of an example wireless communication device 600 in accordance with another aspect of the disclosure. The wireless communication device 600 may be a smart phone, a desktop computer, laptop computer, tablet device, Internet of Things (IoT), wearable wireless device (e.g., wireless watch), and other types of wireless device.

In particular, the wireless communication device 600 includes an integrated circuit (IC) 610, which may be implemented as a system on chip (SOC). The IC 610 includes one or more signal processing cores 620 configured to generate a transmit (Tx) baseband (BB) signal and process a received (Rx) baseband (BB) signal. The IC 610 further includes a phase lock loop (PLL) 630 cascaded with a buffer 640, and collectively configured to generate and provide a clock signal (CLK) to the one or more signal processing cores 620 for controlling various digital computing operations including converting baseband signals between digital and analog to facilitate the generation, processing, transmission, and reception of the Tx BB signal and the Rx BB signal. The buffer 640 may be implemented per buffer 300 previously discussed.

The wireless communication device 600 may further include a transceiver 650 and at least one antenna 660 (e.g., an antenna array). The transceiver 650 is coupled to the one or more signal processing cores 620 to receive therefrom the Tx BB signal and provide thereto the Rx BB signal. The transceiver 650 is configured to convert the Tx BB signal into a transmit (Tx) radio frequency (RF) signal, and convert a received (Rx) RF signal into the Rx BB signal. The transceiver 650 is coupled to the at least one antenna 660 to provide thereto the Tx RF signal for electromagnetic radiation into a wireless medium for wireless transmission, and receive the Rx RF signal electromagnetically picked up from the wireless medium by the at least one antenna 660.

The following provides an overview of aspects of the present disclosure:

Aspect 1: An apparatus, comprising: a buffer configured to receive an input differential signal and generate an output signal based on the input differential signal, wherein the buffer comprises a first buffer stage comprising: a first field effect transistor (FET); a second FET coupled in series with the first FET between a first voltage rail and a second voltage rail; a third FET; a fourth FET coupled in series with the third FET between the first voltage rail and the second voltage rail, wherein the first and third FETs include gates coupled together, and wherein the second and fourth FETs include gates configured to receive positive and negative components of the input differential signal, respectively; and a first capacitor coupled between a drain of the second FET and the gates of the first and third FETs.

Aspect 2: The apparatus of aspect 1, wherein the first buffer stage comprises: a first resistor coupled between the drain of the second FET and the gates of the first and third FETs; and a second resistor coupled between a drain of the fourth FET and the gates of the first and third FETs.

Aspect 3: The apparatus of aspect 1 or 2, wherein the first buffer stage further comprises: a second capacitor including a first terminal configured to receive the positive component of the input differential signal and a second terminal coupled to the gate of the second FET; and a third capacitor including a first terminal configured to receive the negative component of the input differential signal and a second terminal coupled to the gate of the fourth FET.

Aspect 4: The apparatus of any one of aspects 1-3, wherein the first buffer stage further comprises a gate bias circuit configured to generate first and second gate bias voltages for the gates of the second and fourth FETs, respectively.

Aspect 5: The apparatus of aspect 4, wherein the gate bias circuit comprises: a current source; a diode-connected FET coupled in series with the current source between the first voltage rail and the second voltage rail; a first resistor coupled between a gate of the diode-connected FET and the gate of the second FET; and a second resistor coupled between the gate of the diode-connected FET and the gate of the fourth FET.

Aspect 6: The apparatus of aspect 5, wherein: each of the first and third FETs comprises a p-channel metal oxide semiconductor FET (PMOS FET); and each of the second, fourth, and fifth FETs comprises an n-channel metal oxide semiconductor FET (NMOS FET).

Aspect 7: The apparatus of aspect 5, wherein: each of the first and third FETs comprises an n-channel metal oxide semiconductor FET (NMOS FET); and each of the second, fourth, and fifth FETs comprises a p-channel metal oxide semiconductor FET (PMOS FET).

Aspect 8: The apparatus of any one of aspects 1-7, wherein the buffer comprises a second buffer stage configured to generate the output signal.

Aspect 9: The apparatus of aspect 8, wherein the second buffer stage comprises: an inverter including an input, and an output configured to produce the output signal; a feedback resistor coupled between the output and input of the inverter; and a second capacitor coupled between a drain of the fourth FET and the input of the inverter.

Aspect 10: The apparatus of any one of aspects 1-9, further comprising an oscillator configured to generate the input differential signal.

Aspect 11: The apparatus of aspect 10, wherein the oscillator comprises a voltage controlled oscillator (VCO).

Aspect 12: An apparatus, comprising: a phase locked loop (PLL) configured to generate a differential clock signal; and a buffer configured to receive the differential clock signal and generate an output clock signal based on the differential clock signal, wherein the buffer comprises a first buffer stage comprising: a first field effect transistor (FET); a second FET coupled in series with the first FET between a first voltage rail and a second voltage rail; a third FET; a fourth FET coupled in series with the third FET between the first voltage rail and the second voltage rail, wherein the first and third FETs include gates coupled together, and wherein the second and fourth FETs include gates configured to receive positive and negative components of the differential clock signal, respectively; and a first capacitor coupled between a drain of the second FET and the gates of the first and third FETs.

Aspect 13: The apparatus of aspect 12, wherein the first buffer stage further comprises: a first resistor coupled between the drain of the second FET and the gates of the first and third FETs; and a second resistor coupled between a drain of the fourth FET and the gates of the first and third FETs.

Aspect 14: The apparatus of aspect 12 or 13, wherein the first buffer stage further comprises: a second capacitor including a first terminal configured to receive the positive component of the differential clock signal and a second terminal coupled to the gate of the second FET; and a third capacitor including a first terminal configured to receive the negative component of the differential clock signal and a second terminal coupled to the gate of the fourth FET.

Aspect 15: The apparatus of any one of aspects 12-14, wherein the first buffer stage further comprises a gate bias circuit configured to generate first and second gate bias voltages for the gates of the second and fourth FETs, respectively.

Aspect 16: The apparatus of aspect 15, wherein the gate bias circuit comprises: a current source; a diode-connected FET coupled in series with the current source between the first voltage rail and the second voltage rail; a first resistor coupled between a gate of the diode-connected FET and the gate of the second FET; and a second resistor coupled between the gate of the diode-connected FET and the gate of the fourth FET.

Aspect 17: The apparatus of any one of aspects 12-16, wherein the buffer further comprises a second buffer stage configured to generate the output clock signal.

Aspect 18: The apparatus of aspect 17, wherein the second buffer stage comprises: an inverter including an input, and an output configured to produce the output clock signal; a feedback resistor coupled between the output and input of the inverter; and a second capacitor coupled between a drain of the fourth FET and the input of the inverter.

Aspect 19: The apparatus of any one of aspects 12-18, wherein the PLL comprises: a phase-frequency detector (PFD); a charge pump coupled to the PFD; a filter coupled to the charge pump; a voltage controlled oscillator (VCO) coupled to the filter; and a feedback circuit coupled to the VCO by way of the buffer, and to the PFD.

Aspect 20: The apparatus of any one of aspects 12-18, wherein the PLL comprises: a phase-frequency detector (PFD); a charge pump coupled to the PFD; a filter coupled to the charge pump; a voltage controlled oscillator (VCO) coupled to the filter; and a feedback circuit configured to receive the differential clock signal from the VCO, wherein the feedback circuit is further coupled to the PFD.

Aspect 21: A wireless communication device, comprising: at least one antenna; a transceiver coupled to the at least one antenna; one or more signal processing cores coupled to the transceiver; and a buffer coupled to the one or more signal processing cores, wherein the buffer comprises: a first field effect transistor (FET); a second FET coupled in series with the first FET between a first voltage rail and a second voltage rail; a third FET; a fourth FET coupled in series with the third FET between the first voltage rail and the second voltage rail, wherein the first and third FETs include gates coupled together, and wherein the second and fourth FETs include gates configured to receive positive and negative components of a differential clock signal, respectively; and a capacitor coupled between a drain of the second FET and the gates of the first and third FETs.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   a buffer configured to receive an input differential signal and generate an output signal based on the input differential signal, wherein the buffer comprises a first buffer stage comprising:
   a first field effect transistor (FET);
   a second FET coupled in series with the first FET between a first voltage rail and a second voltage rail;
   a third FET;
   a fourth FET coupled in series with the third FET between the first voltage rail and the second voltage rail, wherein the first and third FETs include gates coupled together, and wherein the second and fourth FETs include gates configured to receive positive and negative components of the input differential signal, respectively;
   a first capacitor coupled between a drain of the second FET and the gates of the first and third FETs, and
   a first resistor coupled between the drain of the second FET and the gates of the first and third FETs such that the first resistor is coupled in parallel with the first capacitor.

2. The apparatus of claim 1, wherein the first buffer stage further comprises:
   a second resistor coupled between a drain of the fourth FET and the gates of the first and third FETs.

3. The apparatus of claim 1, wherein the first buffer stage further comprises:
   a second capacitor including a first terminal configured to receive the positive component of the input differential signal and a second terminal coupled to the gate of the second FET; and
   a third capacitor including a first terminal configured to receive the negative component of the input differential signal and a second terminal coupled to the gate of the fourth FET.

4. The apparatus of claim 3, further comprising a gate bias circuit configured to generate first and second gate bias voltages for the gates of the second and fourth FETs, respectively.

5. The apparatus of claim 4, wherein the gate bias circuit comprises:
   a current source;
   a diode-connected FET coupled in series with the current source between the first voltage rail and the second voltage rail;
   a first resistor coupled between a gate of the diode-connected FET and the gate of the second FET; and
   a second resistor coupled between the gate of the diode-connected FET and the gate of the fourth FET.

6. The apparatus of claim 5, wherein:
   each of the first and third FETs comprises a p-channel metal oxide semiconductor FET (PMOS FET); and
   each of the second, fourth, and fifth FETs comprises an n-channel metal oxide semiconductor FET (NMOS FET).

7. The apparatus of claim 5, wherein:
   each of the first and third FETs comprises an n-channel metal oxide semiconductor FET (NMOS FET); and
   each of the second, fourth, and fifth FETs comprises a p-channel metal oxide semiconductor FET (PMOS FET).

8. The apparatus of claim 1, wherein the buffer comprises a second buffer stage configured to generate the output signal.

9. An apparatus, comprising:
   a buffer configured to receive an input differential signal and generate an output signal based on the input differential signal, wherein the buffer comprises a first buffer stage comprising:
   a first field effect transistor (FET);
   a second FET coupled in series with the first FET between a first voltage rail and a second voltage rail;
   a third FET;
   a fourth FET coupled in series with the third FET between the first voltage rail and the second voltage rail, wherein the first and third FETs include gates coupled together, and wherein the second and fourth FETs include gates configured to receive positive and negative components of the input differential signal, respectively; and
   a first capacitor coupled between a drain of the second FET and the gates of the first and third FETs; and wherein the buffer further comprises a second buffer stage configured to generate the output signal, the second buffer stage comprising:
an inverter including an input, and an output configured to produce the output signal;
a feedback resistor coupled between the output and input of the inverter; and
a second capacitor coupled between a drain of the fourth FET and the input of the inverter.

10. The apparatus of claim 1, further comprising an oscillator configured to generate the input differential signal.

11. The apparatus of claim 10, wherein the oscillator comprises a voltage controlled oscillator (VCO).

12. An apparatus, comprising:
a phase locked loop (PLL) configured to generate a differential clock signal; and
a buffer configured to receive the differential clock signal and generate an output clock signal based on the differential clock signal, wherein the buffer comprises a first buffer stage comprising:
a first field effect transistor (FET);
a second FET coupled in series with the first FET between a first voltage rail and a second voltage rail;
a third FET;
a fourth FET coupled in series with the third FET between the first voltage rail and the second voltage rail, wherein the first and third FETs include gates coupled together, and wherein the second and fourth FETs include gates configured to receive positive and negative components of the differential clock signal, respectively;
a first capacitor coupled between a drain of the second FET and the gates of the first and third FETs, and
a first resistor coupled between the drain of the second FET and the gates of the first and third FETs such that the first resistor is coupled in parallel with the first capacitor.

13. The apparatus of claim 12, wherein the first buffer stage further comprises:
a second resistor coupled between a drain of the fourth FET and the gates of the first and third FETs.

14. The apparatus of claim 12, wherein the first buffer stage further comprises:
a second capacitor including a first terminal configured to receive the positive component of the differential clock signal and a second terminal coupled to the gate of the second FET; and
a third capacitor including a first terminal configured to receive the negative component of the differential clock signal and a second terminal coupled to the gate of the fourth FET.

15. An apparatus, comprising:
a phase locked loop (PLL) configured to generate a differential clock signal; and
a buffer configured to receive the differential clock signal and generate an output clock signal based on the differential clock signal, wherein the buffer comprises a first buffer stage comprising:
a first field effect transistor (FET);
a second FET coupled in series with the first FET between a first voltage rail and a second voltage rail;
a third FET;
a fourth FET coupled in series with the third FET between the first voltage rail and the second voltage rail, wherein the first and third FETs include gates coupled together, and wherein the second and fourth FETs include gates configured to receive positive and negative components of the differential clock signal, respectively;
a first capacitor coupled between a drain of the second FET and the gates of the first and third FETs;
a second capacitor including a first terminal configured to receive the positive component of the differential clock signal and a second terminal coupled to the gate of the second FET;
a third capacitor including a first terminal configured to receive the negative component of the differential clock signal and a second terminal coupled to the gate of the fourth FET; and
a gate bias circuit configured to generate first and second gate bias voltages for the gates of the second and fourth FETs, respectively.

16. The apparatus of claim 15, wherein the gate bias circuit comprises:
a current source;
a diode-connected FET coupled in series with the current source between the first voltage rail and the second voltage rail;
a first resistor coupled between a gate of the diode-connected FET and the gate of the second FET; and
a second resistor coupled between the gate of the diode-connected FET and the gate of the fourth FET.

17. The apparatus of claim 12, wherein the buffer further comprises a second buffer stage configured to generate the output clock signal.

18. An apparatus, comprising:
a phase locked loop (PLL) configured to generate a differential clock signal; and
a buffer configured to receive the differential clock signal and generate an output clock signal based on the differential clock signal, wherein the buffer comprises a first buffer stage comprising:
a first field effect transistor (FET);
a second FET coupled in series with the first FET between a first voltage rail and a second voltage rail;
a third FET;
a fourth FET coupled in series with the third FET between the first voltage rail and the second voltage rail, wherein the first and third FETs include gates coupled together, and wherein the second and fourth FETs include gates configured to receive positive and negative components of the differential clock signal, respectively; and
a first capacitor coupled between a drain of the second FET and the gates of the first and third FETs;
wherein the buffer further comprises a second buffer stage configured to generate the output clock signal, the second buffer stage comprising:
an inverter including an input, and an output configured to produce the output clock signal;
a feedback resistor coupled between the output and input of the inverter; and
a second capacitor coupled between a drain of the fourth FET and the input of the inverter.

19. The apparatus of claim 12, wherein the PLL comprises:
a phase-frequency detector (PFD);
a charge pump coupled to the PFD;
a filter coupled to the charge pump;
a voltage controlled oscillator (VCO) coupled to the filter; and
a feedback circuit coupled to the VCO by way of the buffer, and to the PFD.

20. The apparatus of claim 12, wherein the PLL comprises:
- a phase-frequency detector (PFD);
- a charge pump coupled to the PFD;
- a filter coupled to the charge pump;
- a voltage controlled oscillator (VCO) coupled to the filter; and
- a feedback circuit configured to receive the differential clock signal from the VCO, wherein the feedback circuit is further coupled to the PFD.

21. A wireless communication device, comprising:
- at least one antenna;
- a transceiver coupled to the at least one antenna;
- one or more signal processing cores coupled to the transceiver; and
- a buffer coupled to the one or more signal processing cores, wherein the buffer comprises:
  - a first field effect transistor (FET);
  - a second FET coupled in series with the first FET between a first voltage rail and a second voltage rail;
  - a third FET;
  - a fourth FET coupled in series with the third FET between the first voltage rail and the second voltage rail, wherein the first and third FETs include gates coupled together, and wherein the second and fourth FETs include gates configured to receive positive and negative components of a differential clock signal, respectively; and
- a capacitor coupled between a drain of the second FET and the gates of the first and third FETs, and
- a first resistor coupled between the drain of the second FET and the gates of the first and third FETs such that the first resistor is coupled in parallel with the capacitor.

* * * * *